US 9,903,887 B2

United States Patent
Nasu et al.

(10) Patent No.: US 9,903,887 B2
(45) Date of Patent: Feb. 27, 2018

(54) WIRING BOARD FOR DEVICE TESTING (71) Applicant: NGK SPARK PLUG CO., LTD., Nagoya-shi, Aichi (JP)

(72) Inventors: Takakuni Nasu, Komaki (JP); Kengo Tanimori, Kuwana (JP); Kouta Kimata, Nagoya (JP); Guangzhu Jin, Inuyama (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 15/340,279

(22) Filed: Nov. 1, 2016

(65) Prior Publication Data
US 2017/0122981 A1 May 4, 2017

(30) Foreign Application Priority Data
Nov. 3, 2015 (JP) ................. 2015-216205

(51) Int. Cl.
*G01R 1/073* (2006.01)
*H05K 1/02* (2006.01)
(Continued)

(52) U.S. Cl.
CPC ....... *G01R 1/07314* (2013.01); *G01R 1/0491* (2013.01); *G01R 31/2831* (2013.01);
(Continued)

(58) Field of Classification Search
CPC ...... G01R 31/2889; H05K 2201/10674; H01R 2201/20
See application file for complete search history.

(56) References Cited

U.S. PATENT DOCUMENTS

2004/0053444 A1 3/2004 Yoneda et al.
2006/0103004 A1 5/2006 Sakai et al.
(Continued)

FOREIGN PATENT DOCUMENTS

EP 0 180 013 A1 5/1986
EP 0 632 281 A2 1/1995
(Continued)

OTHER PUBLICATIONS

European Patent Office, Extended European Search Report issued in corresponding Application No. 6195614.9, dated Mar. 20, 2017.

*Primary Examiner* — Jermele M Hollington
*Assistant Examiner* — Alvaro Fortich
(74) *Attorney, Agent, or Firm* — Stites & Harbison, PLLC; Jeffrey A. Haeberlin (57) ABSTRACT

Disclosed is a wiring board for simultaneously testing of multiple semiconductor devices. The wiring board includes a multilayer ceramic substrate, an organic wiring structure arranged on the multilayer ceramic substrate, a plurality of capacitor connection pads formed on the organic wiring structure and a plurality of test pads formed on the organic wiring structure. The organic wiring structure has a plurality of inner conductor layers including first and second plane layers. Each of the first plane layers is divided in a plurality of regions. Each of the second plane layer(s) is placed in a different layer from the first plane layers and made larger in area than the first plane layers. At least a part of the test pads of each test pad group is electrically connected to at least a part of the connection pads via an outermost one of the first plane layers.

4 Claims, 4 Drawing Sheets (51) Int. Cl.
  *H05K 1/03* (2006.01)
  *H05K 1/11* (2006.01)
  *G01R 1/04* (2006.01)
  *G01R 31/28* (2006.01)
  *H01L 23/498* (2006.01)

(52) U.S. Cl.
  CPC .... *G01R 31/2889* (2013.01); *H01L 23/49822* (2013.01); *H05K 1/0268* (2013.01); *H05K 1/0306* (2013.01); *H05K 1/111* (2013.01); *G01R 1/07378* (2013.01)

(56) References Cited

U.S. PATENT DOCUMENTS

| | | | |
|---|---|---|---|
| 2009/0051041 A1* | 2/2009 | Otsuka | G01R 1/07378 257/774 |
| 2009/0152693 A1* | 6/2009 | Sato | H01L 25/0657 257/668 |
| 2011/0042795 A1 | 2/2011 | Knickerbocker | |
| 2011/0101349 A1* | 5/2011 | Oda | G01R 31/2884 257/48 |
| 2014/0028341 A1 | 1/2014 | Mikuni et al. | |
| 2015/0080050 A1 | 3/2015 | Kitajima | |
| 2016/0323996 A1 | 11/2016 | Takemura | |

FOREIGN PATENT DOCUMENTS

| | | |
|---|---|---|
| JP | 2005 079144 A | 3/2005 |
| JP | 2009 158761 A | 7/2009 |
| JP | 2014-025761 A | 2/2014 |
| WO | 2015/108051 A1 | 7/2015 |

\* cited by examiner

FIG.10

WIRING BOARD FOR DEVICE TESTING

FIELD OF THE INVENTION

The present invention relates to a wiring board usable for simultaneous testing of multiple semiconductor devices.

BACKGROUND OF THE INVENTION

It is common practice to use a so-called "probe card" as a test jig for the electrical test of a wafer with multiple semiconductor devices. The probe card includes a test wiring board with a plurality of probes, which is called a "space transformer (STF)". The test wiring board is generally mounted on a printed wiring board via a relay board. In the electrical test, the probe card is electrically connected to a tester while the plurality of probes are brought into contact with connection terminals of the semiconductor device as a device under test (DUT). In this state, various test signals are inputted and outputted by the supply of power from the tester such that the electrical continuity of the semiconductor device can be checked based on the test signals.

In recent years, there is a demand to simultaneously test multiple semiconductor devices in parallel for the purpose of improvement in test efficiency. For example, Japanese Laid-Open Patent Publication No. 2014-025761 (abbreviated as "JP 2014-25761 A") discloses a probe card for such simultaneous multi-DUT testing. There is an additional demand to not only check the electrical conductivity of the semiconductor device, but also check whether the semiconductor device functions normally, during the simultaneous multi-DUT test. In response to such a demand, it has been proposed to mount various electronic components on the test wiring board of the probe card.

Figures 9, 10:
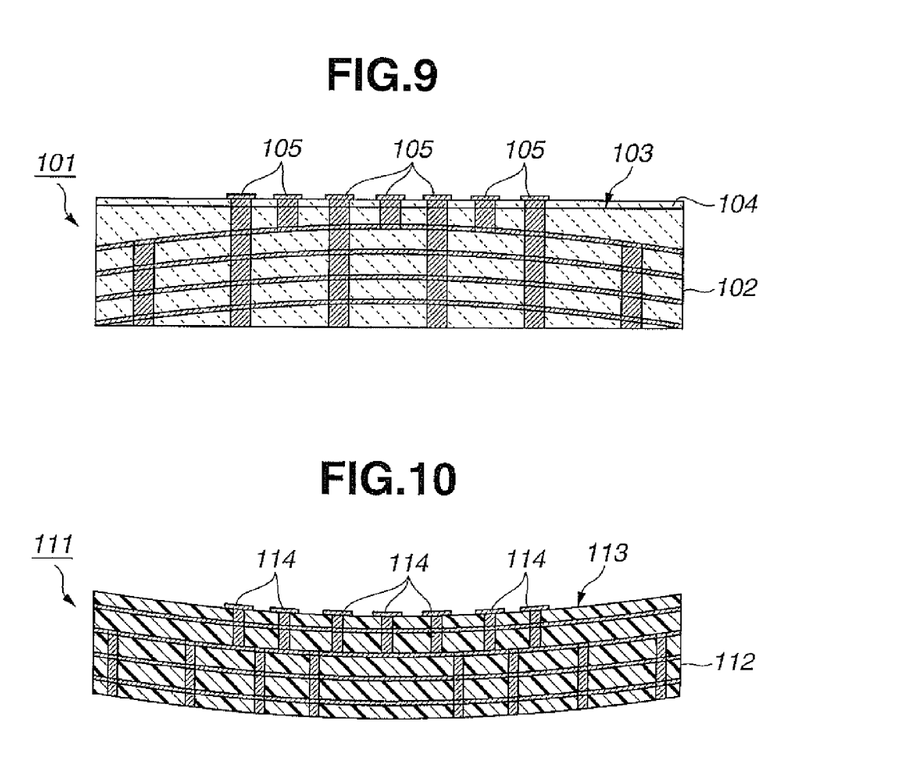
FIG. 9 is a cross-sectional view of a conventional test wiring board with a multilayer ceramic substrate.
FIG. 10 is a cross-sectional view of another conventional test wiring board with a multilayer organic substrate.

One example of conventional test wiring board 101 is shown in FIG. 9, which includes a multilayer ceramic substrate 102 (as a main body) and a single thin conductor film layer 105 stacked on a main surface 103 of the multilayer ceramic substrate 102 via an insulating resin layer 104. In the conventional wiring board 101, a portion of the thin conductor film layer 105 is configured as a plurality of test pads to which probes are mounted; and the other portion of the thin conductor film layer 105 is configured as a plurality of connection pads to which chip capacitors are connected. The probe card of JP 2014-25761 A has a test wiring board that is basically similar in structure to this test wiring board 101.

Another example of conventional test wiring board 111 is shown in FIG. 10, which includes a multilayer organic substrate 112 (as a main body) and a thin conductor film layer 114 stacked on a main surface 113 of the multilayer organic substrate 112. In the conventional wiring board 111, the thin conductor film layer 114 is configured as a plurality of test pads and as a plurality of capacitor connection pads in the same manner as above.

The conventional test wiring boards 101, 111 utilize an inner conductor layer of the substrate 102, 112 as a so-called power plane layer to provide a plurality of power channels to different-voltage power supplies for the electrical operation test of the semiconductor device.

SUMMARY OF THE INVENTION

In order to perform the electrical operation test of the semiconductor devices with different-voltage power supplies, it is necessary to minimize the distance from the capacitor connection pads to the power plane layer. It is further necessary to prevent or minimize variation in the distance from the capacitor connection pads to the power plane layer.

However, the above conventional test wiring boards 101 and 111 of FIGS. 9 and 10 have the following problems.

In the case of the conventional test wiring board 101, warpage of inner conductor layers of the multilayer ceramic substrate 102 occurs during sintering so that the distance between the power plane layer and the capacitor connection pads on an outer peripheral portion of the wiring board differs from the distance between the power plane layer and the capacitor connection pads on a center portion of the wiring board. There thus arises variation in the distance from the capacitor connection pads to the power plane layer. Due to such variation, it is impossible to sufficiently improve the accuracy of the test at a high frequency range. Although the multilayer ceramic substrate 102 is subjected to surface grinding after the sintering, it is impossible to reduce the thickness of the entire multilayer ceramic substrate 102 due to the warpage of the inner conductor layers. Further, there also occurs shrinkage of the multilayer ceramic substrate 102 during the sintering. Due to such shrinkage, it is difficult to achieve the high dimension accuracy of the multilayer ceramic substrate 102 by itself so that the number of DUT tends to be limited.

In the case of the test wiring board 111, the multilayer organic substrate 112 is low in heat resistance and shows a difference in thermal expansion coefficient relative to silicon so that the probes on the test pads may be displaced with respect to the connection terminals of the semiconductor devices during the progress of the test under thermal stress conditions. In such displaced state, it is not possible to simultaneously test the multiple semiconductor devices with reliability. Further, the test wiring board 111 is low in stiffness and flexible so that the probes on the test pads may be in poor contact with or may not be in contact with the semiconductor devices depending on the positions of the semiconductor devices during the multi-DUT test. In such poor contact state or non-contact state, it is also not possible to simultaneously test the semiconductor devices with reliability.

The present invention has been made in view of the above circumstances. It is an object of the present invention to provide a wiring board which has less variation in the distance from capacitor connection pads to power plane layer so as to improve the accuracy of simultaneous multi-DUT test even at a high frequency range and, at the same time, has high stiffness so as to ensure the reliability of simultaneous multi-DUT test even under thermal stress conditions.

According to one aspect of the present invention, there is provided a wiring board for simultaneous testing of multiple semiconductor devices, comprising: a multilayer ceramic substrate having a plurality of ceramic layers and a plurality of conductor layers alternately stacked to each other; an organic wiring structure arranged on a main surface of the multilayer ceramic substrate; a plurality of connection pads formed on a surface of the organic wiring structure for connection to capacitors; and a plurality of test pad groups formed on the surface of the organic wiring structure, each of the test pad groups having a plurality of test pads for testing of any one of the semiconductor devices, the organic wiring structure having a plurality of insulating resin layers and a plurality of inner conductor layers alternately stacked to each other such that one of the plurality of insulating resin layers is located outermost of the organic wiring structure, the plurality of inner conductor layers including a plurality of first plane layers and one or more second plane layers, each of the plurality of first plane layers being divided in a plurality of regions as viewed from the surface of the organic wiring structure, each of the one or more second plane layers being placed in a different layer from the first plane layers and having an area larger than that of the first plane layer as viewed from the surface of the organic wiring structure, at least a part of the test pads of each of the test pad groups being electrically connected to at least a part of the connection pads via an outermost one of the first plane layers.

In the test wiring board according to the present invention, the organic wiring structure is arranged on the multilayer ceramic substrate (that is, the multilayer ceramic substrate is utilized as a base to support thereon the organic wiring layer); and at least the part of the test pads of each of the test pad groups is electrically connected to at least the part of the connection pads via the outermost one of the first plane layers of the organic wiring structure.

Hence, the test wiring board according to the present invention has a short distance from the connection and test pads to the inner conductor layer and shows less variation in the distance from the connection and test pads to the inner conductor layer as compared to the above-mentioned conventional test wiring board 101 where the test and connection pads are connected via the inner conductor layer of the multilayer ceramic substrate 102. It is therefore possible to, even when the multiple semiconductor devices are simultaneously tested at a high-frequency weak current level, improve the accuracy of the test.

The test wiring board according to the present invention as a whole shows improved heat resistance and stiffness as compared to the above-mentioned conventional test wiring board 111 where only the organic wiring substrate 112 is provided with no base. Namely, the test wiring board according to the present invention shows a smaller difference in thermal expansion coefficient relative to silicon so that probes on the test pads are unlikely to be displaced in position with respect to connection terminals of the semiconductor device even under thermal stress conditions. It is therefore possible to simultaneously test the multiple semiconductor devices with reliability even under the thermal stress conditions. Since the test wiring board according to the present invention is improved in stiffness and thereby less deformable during the test, the probes on the test pads are held in proper contact with the connection terminals of the semiconductor devices regardless of the positions of the semiconductor devices. It is also possible, in this respect, to simultaneously test the multiple semiconductor devices with reliability.

It is further possible for the test wiring board according to the present invention to increase the number of the semiconductor devices adoptable as DUT as compared to the conventional test wiring boards 101, 111.

In the above configuration, the distance from the connection and test pads to the outermost first plane layer is preferably 70 μm or less (more preferably 60 μm or less).

The plurality of test pad groups, each including the plurality of test pads for testing of the semiconductor device, are formed at a given location on the surface of the organic wiring structure. The plurality of connection pads for connection to the capacitors are formed at another location on the surface of the organic wiring structure. The test pad groups are provided corresponding to the number of the semiconductor devices to be tested (i.e. the number of DUT). There is no particular limitation on the number of the test pad groups formed on the organic wiring structure. Any number of test pad groups can be formed on the organic wiring structure. It is feasible in the present invention to provide ten or more test pad groups on the organic wiring structure.

In the case of the above-mentioned conventional test wiring board 101 with the multilayer ceramic substrate 102, the maximum number of DUT in one simultaneous test is four. Consequently, the number of test pad groups on the multilayer ceramic substrate 102 of the conventional test wiring board 101 is in general four or less.

In the case of the above-mentioned conventional test wiring board 111 with the multilayer organic substrate 112, the maximum number of DUT in one simultaneous test is two. The number of test pad groups on the multilayer organic substrate 112 of the conventional test wiring board 111 is consequently in general two or less.

There is no particular limitation on the locations of the plurality of connection pads (connection pad groups) and the plurality of test pads (test pad groups) as long as the plurality of connection pads and the plurality of test pads are located on the surface of the organic wiring structure. The locations of the connection pads and the test pads can be set arbitrarily. In view of the DUT layout, it is preferable that: the plurality of test pad groups are located intensively on a center portion of the wiring board; and the plurality of connection pad groups are located on an outer peripheral portion of the wiring board around the plurality of test pad groups.

In the present invention, the plurality of insulating resin layers and the plurality of inner conductor layers are alternately stacked to each other such that one of the plurality of insulating resin layers is located outermost of the organic wiring structure. There is no particular limitation on the numbers of the insulating resin layers and inner conductor layers in the organic wiring structure. The organic wiring structure can have any number of (i.e. two or more) insulating resin layers and any number of (i.e. two or more) inner conductor layers. It is preferable that the numbers of the insulating resin layers and the inner conductor layers are respectively four or more, more preferably six or more. The reason for this is that, when the organic wiring structure has larger numbers of insulating resin layers and inner conductor layers, the test wiring board can suitably provide a plurality of power channels to different-voltage power supplies for the operation test of the semiconductor devices.

Furthermore, the insulating resin layers are formed by stacking a plurality of sheets of insulating resin film, rather than by a known build-up process, in the present invention. In the built-up process, there is likely to occur variation in the thickness of the insulating resin layers depending on the presence or absence of the inner conductor layers. It is however possible in the present invention to resolve variation in the thickness of the insulating resin layers by stacking the insulating resin film sheets.

The insulating resin film can be selected as appropriate in view of the insulating properties, heat resistance, moisture resistance etc. Examples of the insulating resin films are films of epoxy resin, polyimide resin, phenol resin, urethane resin, bismaleimide-triazine resin, polyphenylene ether resin, polyether ether ketone resin and the like. Among others, a film of polyimide resin having high heat resistance and strength is preferred. The use of such a polyimide film makes the test wiring board suitable for testing of the multiple semiconductor devices under thermal stress conditions.

There is also no particular limitation on the thickness of the insulating resin film. The thickness of the insulating resin film can be adjusted as appropriate. Preferably, the insulating resin film has a thickness of 10 μm to 50 μm (more preferably 20 µm to 40 µm). When the thickness of the insulating resin film is in this preferable range, it is possible to certainly ensure the short distance from the connection pads to the specific inner conductor layer (first plane layer) while maintaining the stiffness of the insulating resin film. If the thickness of the insulating resin film is smaller than 10 µm, the insulating resin film may be low in stiffness. If the thickness of the insulating resin film exceeds 50 µm, it is difficult to ensure the short distance from the connection pads to the specific inner conductor layer (first plane layer).

Each of the inner conductor layers of the organic wiring structure and the conductor layers (connection pads and test pads) on the surface of the organic wiring structure can be formed of a conductive metal material. Examples of the conductive metal material are copper, nickel, gold, tin, silver, tungsten, cobalt, titanium and alloys thereof. Among others, copper is preferred in view of the cost efficiency and electrical conductivity. It is feasible to form the conductor layer by applying a foil of the conductive metal material to the insulating resin film and etching the foil as needed. In this case, there can preferably be used e.g. a copper foil/polyimide film sheet in which a copper foil is applied to one side of polyimide film. By the use of such a metal foil/resin film sheet, it is possible to certainly shorten the time of production of the test wiring board.

The inner conductor layers of the organic wiring structure include the first and second plane layers. Each of the first plane layers is divided into the plurality of regions as viewed from the surface of the organic wiring structure. Each of the second plane layer(s) is placed in a different layer from the first plane layer and is made larger in area than the first plane layer as viewed from the surface of the organic wiring structure. It is preferable to utilize the first plane layers as plane layers for supplying power (hereinafter called "power plane layers") and utilize the second plane layer(s) as plane layer(s) for providing proper grounding (hereinafter called "ground plane layers"). The first plane layers as the power plane layers may be arranged in a multilayer configuration within the organic wiring structure so as to allow the passage of different-voltage power currents. In such a case, the lowest-voltage power current may be passed through the outermost first plane layer so as to enable the operation test under the minimum voltage conditions required for operation of the semiconductor devices. Further, the connection pad groups may be respectively electrically connected to the test pad groups via the different regions of the outermost first plane layer.

The other objects and features of the present invention will also become understood from the following description.

DESCRIPTION OF EMBODIMENTS

A probe card 11 according to one embodiment of the present invention will be described in detail below with reference to FIGS. 1 to 8.

Figure 1:
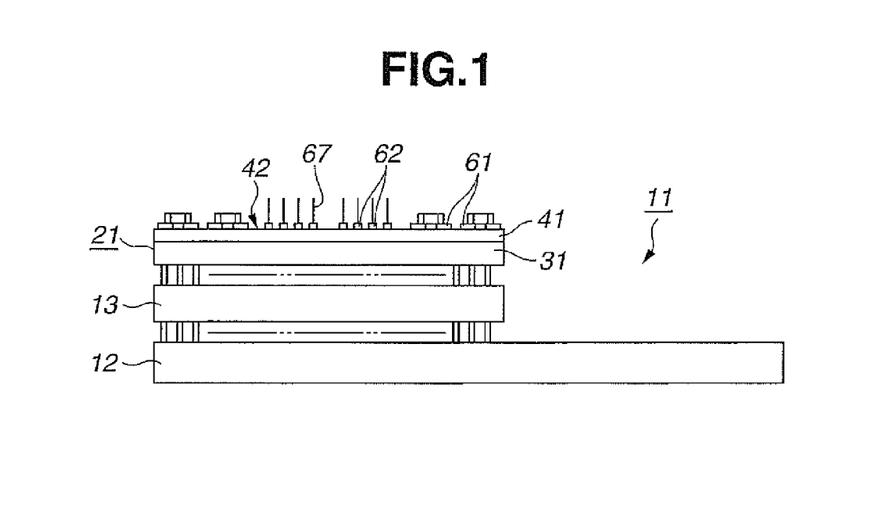
FIG. 1 is a schematic view of a probe card with a test wiring board according to one embodiment of the present invention.

The probe card 11 is adapted as a test jig for the simultaneous electrical test of a wafer with multiple semiconductor devices (in the present embodiment, four semiconductor devices). As shown in FIG. 1, the probe card 11 has a printed wiring board 12 electrically connected to a tester, a test wiring board 21 (called "STF") mounted on the printed wiring board 12 via a relay board 13 and a plurality of probes 67 disposed on a surface of the test wiring board 21.

The test wiring board 21 includes a multilayer ceramic substrate 31 (as a base), an organic wiring structure 41 arranged on a main surface 32 of the multilayer ceramic substrate 31 as shown in FIGS. 1 to 4.

Figure 3:
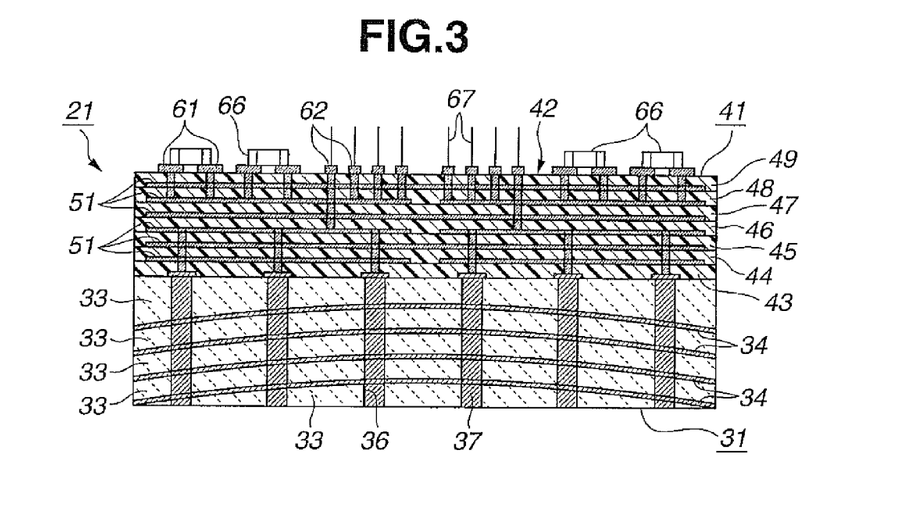
FIG. 3 is a cross-sectional view of the test wiring board according to the one embodiment of the present invention.

As shown in FIG. 3, the multilayer ceramic substrate 31 has a plurality of ceramic layers 33 and a plurality of conductor layers 34 alternately stacked to each other. Each of the ceramic layers 33 is in the form of e.g. a sintered alumina layer. Each of the conductor layers 34 is in the form of e.g. a metallized layer of tungsten, molybdenum or an alloy thereof.

Through holes 36 (also called "via holes") are formed through the respective ceramic layers 33 in a thickness direction of the multilayer ceramic substrate 31. In the present embodiment, the inner diameter of the through holes 35 is set to about 60 µm. Through conductors 37 (also called "via conductors) are formed in the respective through holes 36 and electrically connected to the conductor layers 34.

Further, a plurality of connection terminals 38 are formed on the main surface 32 of the multilayer ceramic substrate 31 at positions corresponding to the through conductors 37. Each of the connection terminals 38 is circular in cross section with a diameter of about 1.0 mm in the present embodiment.

Figure 2:
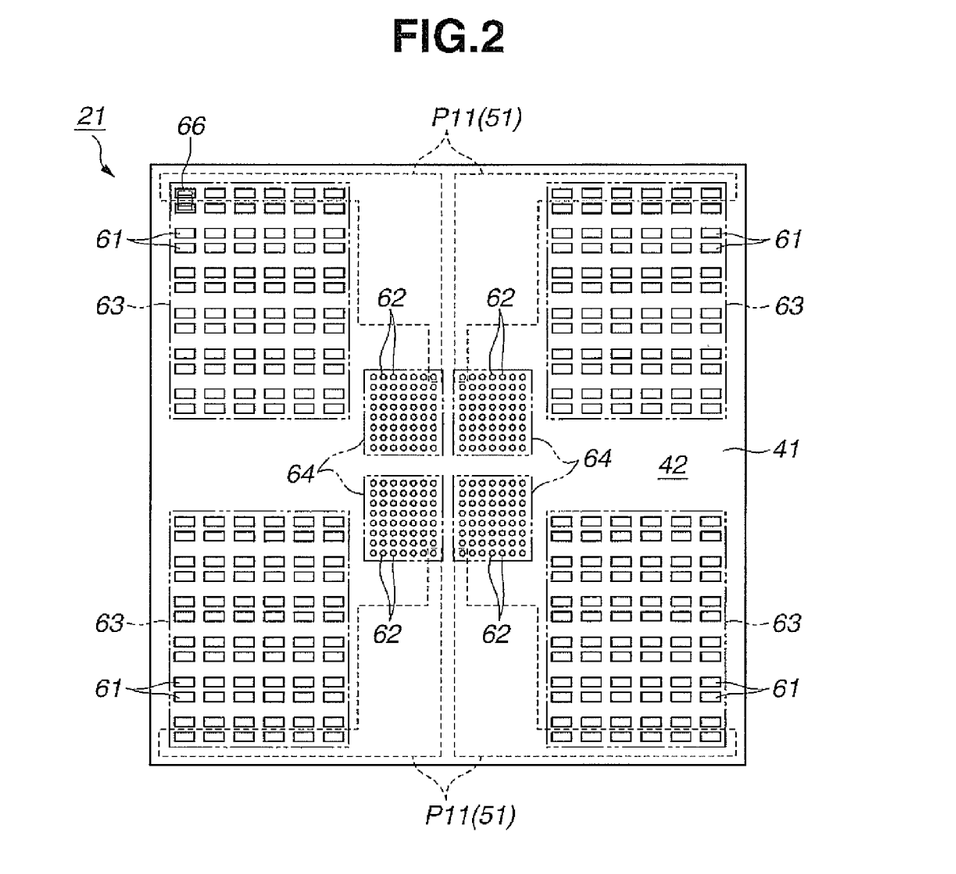
FIG. 2 is a plan view of the test wiring board according to the one embodiment of the present invention.
Figure 4:
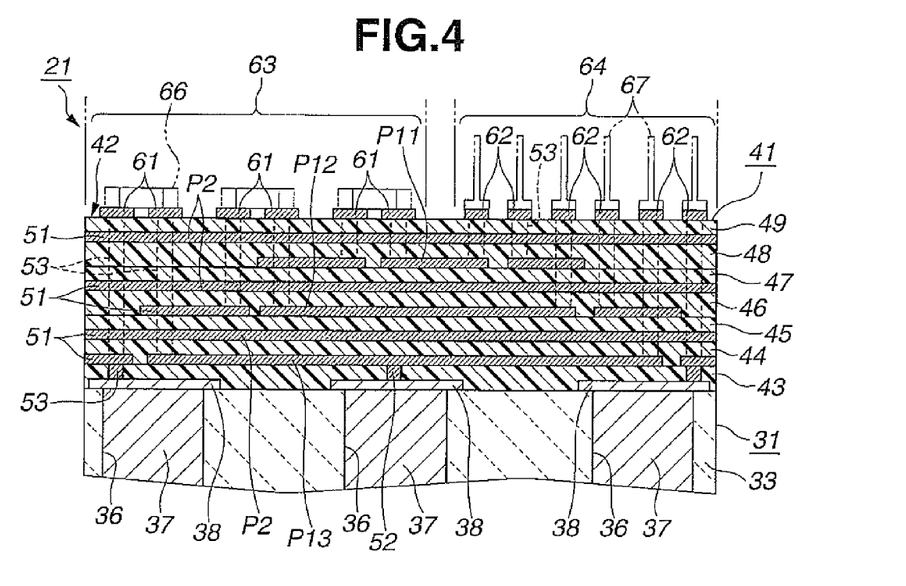
FIG. 4 is an enlarged cross-sectional view of part of the test wiring board according to the one embodiment of the present invention.

As shown in FIGS. 2 to 4, the organic wiring structure 41 has a plurality of insulating resin layers 43 to 49 and a plurality of inner conductor layers 51 alternately stacked to each other such that the insulating resin layer 49 is located outermost of the organic wiring structure 41. In the present embodiment, each of the insulating resin layers 43 to 49 is in the form of an insulating layer of polyimide film 72 (see also FIG. 5). More specifically, the polyimide film 72 includes a first layer made of a thermosetting polyimide resin and second layers made of a thermoplastic polyimide resin on both sides of the first layers although not so shown in the drawings. In the present embodiment, the thickness of the first layer is set to about 15 μm; and the thickness of the second layers is set to about 5 μm. In consequence, each of the insulating resin layers 43 to 49 has a thickness of about 25 μm. Further, each of the inner conductor layers 51 is in the form of a layer of copper foil 73 applied with a thickness of about 5 μm to the polyimide film 72 (see also FIG. 5) in the present embodiment.

Via holes 52 are formed in the respective insulating resin layers 43 to 49. Via conductors 53 are formed in the respective via holes 52 for electrical connection of the inner conductor layers 51. Each of the via holes 52 is circular in cross section with an inner diameter of about 30 μm.

In the present embodiment, the pitch between the via conductors 53 of the organic wiring structure 41 is made smaller than the pitch between the through conductors 37 of the multilayer ceramic substrate 31 as shown in FIGS. 3 and 4.

As shown in FIG. 2, the test wiring board 21 further includes a plurality of connection pad groups 63 and a plurality of test pad groups 64 formed on a surface 42 of the organic wiring structure 41 (i.e. a surface of the outermost insulating resin layer 49). Each of the connection pad groups 63 consists of a plurality of connection pads 61 for connection to chip capacitors 66. Each of the test pad groups 64 consists of a plurality of test pads 62 for testing of the semiconductor device. In the present embodiment, four test pad groups 64 are located adjacent to each other on a center portion of the wiring board. In each test pad group 64, the test pads 62 are arranged in an array. Each test pad 62 is circular in plan with a diameter of about 50 μm. The connection pad groups 63 are located on an outer peripheral portion of the wiring board so as to surround the test pad groups 64. In each connection pad group 63, the connection pads 61 are also arranged in an array. Each connection pad 61 is rectangular in plan with an area larger than that of the test pad 62. As shown in FIGS. 3 and 4, the chip capacitor 66 is mounted on a pair of the connection pads 61; and the probe 67 is mounted in a vertical position on the test pad 62.

The inner conductor layers 51 of the organic wiring structure 41 will be explained in more detail below.

As shown in FIG. 4, the inner conductor layers 51 include first plane layers P11, P12, P13 and second plane layers P2. The first plane layer P13 is provided on the first (innermost) insulating resin layer 43. The second plane layer P2 is provided on the second insulating resin layer 44. The first plane layer P12 is provided on the third insulating resin layer 45. The second plane layer P2 is provided on the fourth insulating resin layer 46. The first plane layer P11 is provided on the fifth insulating resin layer 47. The second plane layer P2 is provided on the sixth insulating resin layer 48. In other words, the first plane layers P11, P12, P13 and the second plane layers P2 are stacked in an alternate arrangement. In particular, the outermost second plane layer P2 is located outside of the first plane players P11, P12, P13 in the present embodiment.

The first plane layer P11 is divided into four regions as viewed in plan (i.e. as viewed from the surface 42 of the organic wiring structure 41) such that the divided four regions lie within the same layer as shown in FIG. 2. The first plane layer P12, P13 is also divided into four regions as in the case of the first plane layer P11.

The three first plane layer P11, P12, P13 are configured as power plane layers for supplying power to the respective semiconductor devices (as DUT). In the present embodiment, these first plane layers P11, P12, P13 are arranged in a multilayer configuration within the organic wiring structure 41, as shown in FIG. 4, so as to allow the passage of different-voltage power currents therethrough.

More specifically, the outermost first plane layer P11 is configured as a power plane layer to supply low-voltage power current (i.e. a minimum voltage required for operation of the respective DUT). The connection pads 61 and the test pads 62 on the surface 42 of the organic wiring structure 41 are electrically connected to the first plane layer P11 via the via conductors 53. The distance from the pads 61 and 62 to the first plane layer P11 is equivalent to the thickness of two sheets of the polyimide film 72, that is, about 50 to 60 μm. As shown in FIG. 2, the connection pads 61 of the respective connection pad groups 63 and the test pads 62 of the respective test pad groups 64 are electrically connected to each other via the different regions of the first plane layer P11.

The intermediate first plane layer P12 is configured as a power plane layer to supply middle-voltage power current. The connection pads 61 and the test pads 62 on the surface 42 of the organic wiring structure 41 are electrically connected to the first plane layer P12 via the via conductors 53. The distance from the pads 61 and 62 to the first plane layer P12 is equivalent to the thickness of four sheets of the polyimide film 72, that is, about 110 to 120 μm.

The innermost first plane layer P13 is configured as a power plane layer to supply high-voltage power current. The connection pads 61 and the test pads 62 on the surface 42 of the organic wiring structure 41 are electrically connected to the first plane layer P13 via the via conductors 53. The distance from the pads 61 and 62 to the first plane layer P13 is equivalent to the thickness of six sheets of the polyimide film 72, that is, about 170 to 180 μm.

Consequently, the power conduction path through the first plane layer P11 for the supply of the low-voltage power current is the shortest among the three power conduction paths through the first plane layers P11, P12, P13.

By contrast, the three second plane layer P2 are configured as ground plane layers for providing proper grounding. These second plane layers P2 are arranged in different layers from the first plane layers P11, P12, P13. Each of the second plane layers P2 is in the form of a solid pattern extending along almost the whole of the wiring board and thereby having an area larger than the total area of the first plane layer P11, P12, P13.

A production method of the test wiring board 21 will be next explained below. Herein, the multilayer ceramic substrate 31 and the respective sheet materials of the organic wiring structure 41 are formed separately.

The multilayer ceramic substrate 31 is formed by the following procedure. First, a plurality of green sheets are prepared using an alumina-based ceramic material. A plurality of the through holes 36 are formed at given positions in the respective green sheets by a hole formation process such as laser processing, punching or drilling. A conductive paste (e.g. tungsten paste) is filled into the respective through holes by means of a conventional paste printing machine, whereby the through conductors 37 are provided in unfired (green) form. The conductive paste is also printed on front and back surfaces of the green sheets by means of the paste printing machine, whereby the conductor layers 34 are provided in unfired (green) form. A ceramic stack body is then formed by, after drying the conductive paste, stacking the green sheets together and compressing the green sheets into one with the application of a pressing force in a sheet stacking direction. Subsequently, the ceramic stack body is subjected to degreasing and fired at a predetermined temperature for a predetermined time. By this firing, alumina in the green sheets and tungsten in the conductive paste are simultaneously sintered. As a result of the sintering, the multilayer ceramic substrate 31 is obtained. The thus-obtained multilayer ceramic substrate 31 is subjected to surface grinding.

Figure 5:
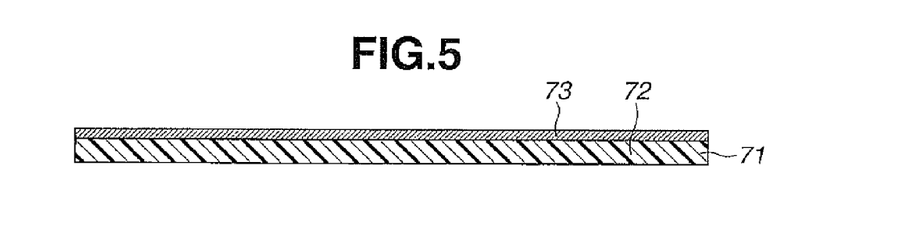
FIG. 5 is a schematic cross-sectional view of a copper foil/polyimide film sheet used for a production method of the test wiring board according to the one embodiment of the present invention.
Figure 6:
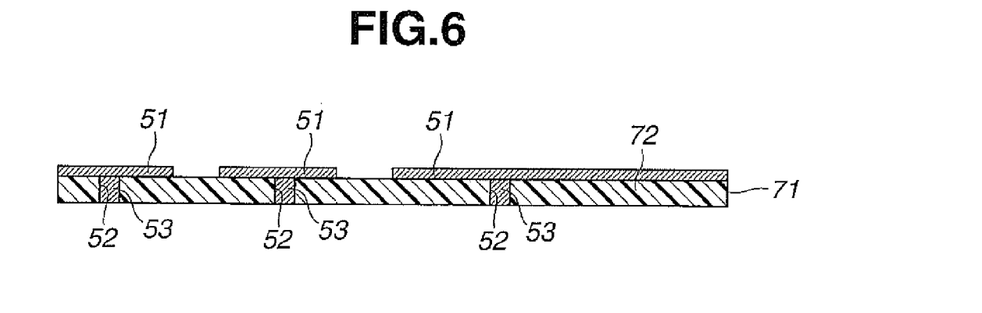
FIG. 6 is a schematic cross-sectional view showing a state after the formation of an inner conductor layer and via conductors during the production method of the test wiring board according to the one embodiment of the present invention.
Figure 7:
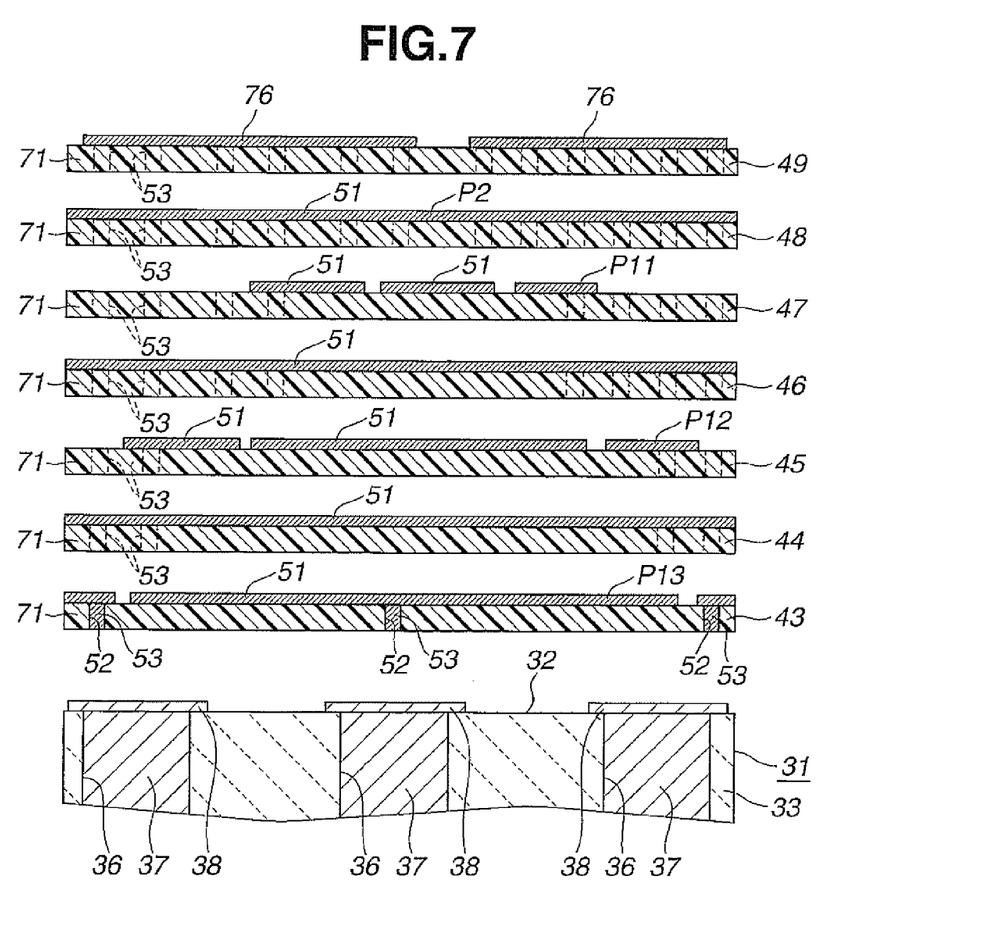
FIG. 7 is an enlarged cross-sectional view showing a process of stacking sheet materials of an organic wiring structure on a multilayer ceramic substrate during the production method of the test wiring board according to the one embodiment of the present invention.

On the other hand, the sheet materials of the organic wiring structure 41 are each separately formed by the following procedure. First, a copper foil/polyimide film sheet 71 is prepared by applying the copper foil 73 of thickness 5 μm to one side of the polyimide film 72 of thickness 25 μm as shown in FIG. 5. As mentioned above, the polyimide film 72 includes a first layer made of thermosetting polyimide resin and second layers made of thermoplastic polyimide resin on both sides of the first layers. Then, laser processing is performed at given positions on the copper foil/polyimide film sheet 71. By the laser processing, a plurality of via holes 52 are formed through the film sheet 71 in a thickness direction of the film sheet. A conductive paste (e.g. silver paste) is filled into the respective via holes by means of a conventional paste printing machine and heated at about 180° C. for 1 hour, whereby the via conductors 53 are provided (see FIG. 6). The copper foil 73 is subsequently patterned by a subtractive process. In the case of the copper foil/polyimide film sheet 71 for the formation of the outermost insulating resin layer 49, a solid intermediate conductor pattern 76 (corresponding to the plurality of connection pad groups 63 and the plurality of test pad groups 44) is given by subtractive patterning of the copper foil 73 as shown in FIG. 7. In the case of the copper foil/polyimide film sheet 71 for the formation of the other insulating resin layer 43, 44, 45, 46, 47, 48, the inner conductor layer 51 of predetermined pattern is given by subtractive patterning of the copper foil 73 as shown in FIG. 7.

Figure 8:
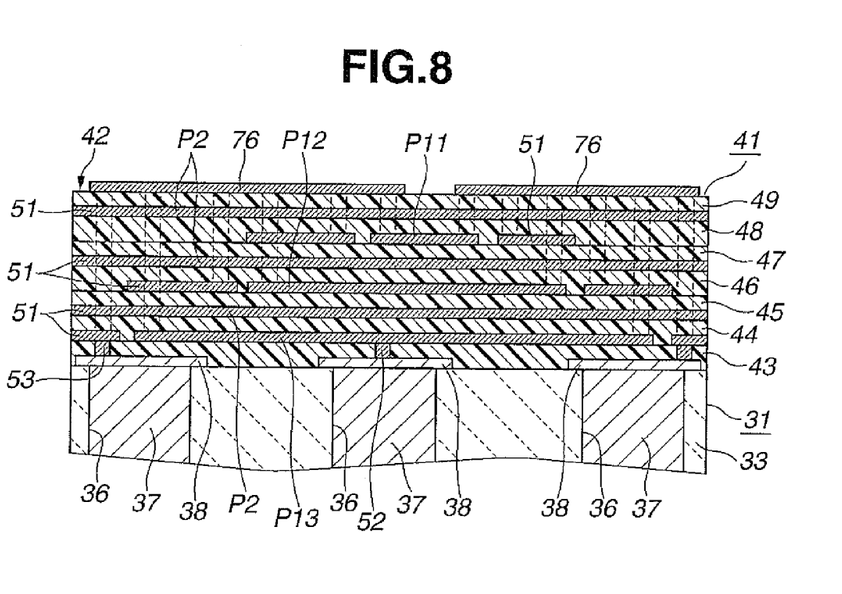
FIG. 8 is an enlarged cross-sectional view showing a state in which the organic wiring structure and the multilayer ceramic substrate are bonded together during the production method of the test wiring board according to the one embodiment of the present invention.

The above-obtained seven patterned copper foil/polyimide film sheets 71 are stacked on the main surface 32 of the multilayer ceramic substrate 31. The patterned copper foil/polyimide film sheets 71 and the multilayer ceramic substrate 31 are pressed against each other with the application of a pressure of about 5 to 100 kgf/cm$^2$ under heated conditions of about 200 to 400° C., whereby the insulating resin layers 43 to 49 and the multilayer ceramic substrate 31 are bonded together as shown in FIG. 8. After that, the solid intermediate conductor pattern 76 is finely etched by a subtractive process and thereby formed into the connection pads 61 and the test pads 62. The test wiring board 21 is completed in this way.

Accordingly, the present embodiment provides the following effects.

(1) In the test wiring board 21, the multilayer organic wiring structure 41 is arranged on the main surface 32 of the multilayer ceramic substrate 31. In particular, a part (one or more) of the test pads 62 of each test pad group 64 is electrically connected to a part (one or more) of the connection pads 61 via the outermost first plane layer P11. The test wiring board 21 hence has a short distance from the pads 61 and 62 to the inner conductor layer 51 (first plane layer P11) and shows less variation in the distance from the pads 61 and 62 to the inner conductor layer 51 (first plane layer P11) as compared to the aforementioned conventional test wiring board 101 where the test and connection pads are connected via the inner conductor layer of the multilayer ceramic substrate 102. It is therefore possible to, even when the multiple semiconductor devices are simultaneously tested at a high-frequency weak current level, improve the accuracy of the test.

A low power impedance is required in the electrical test of an application processing unit (APU) due to the reason that the electrical test of the APU is performed by the supply of a high-frequency weak current. The test wiring board 21 sufficiently meets such a requirement.

(2) Since the organic wiring structure 41 is arranged on the multilayer ceramic substrate 31 (as the base) in the test wiring board 21, the test wiring board 21 as a whole shows improved heat resistance and stiffness as compared to the aforementioned conventional test wiring board 111 where only the organic wiring substrate 112 is provided with no base. Namely, the test wiring board 21 shows a smaller difference in thermal expansion coefficient relative to silicon so that the probes 67 on the test pads 62 are unlikely to be displaced in position with respect to connection terminals of the semiconductor device even under thermal stress conditions. It is therefore possible to simultaneously test the multiple semiconductor devices with reliability even under the thermal stress conditions. Because of the improved stiffness of the test wiring board 21, the test wiring board 21 is less deformable during the test so that the probes 67 on the test pads 62 are held in proper contact with the connection terminals of the semiconductor devices regardless of the positions of the semiconductor devices. It is also possible, in this respect, to simultaneously test the multiple semiconductor devices with reliability.

It is further possible for the test wiring board 21 to increase the number of the semiconductor devices adoptable as DUT as compared to the conventional test wiring boards 101, 111.

(3) In the present embodiment, the plurality of (seven) insulating resin layers 43 to 49 and the plurality of (six) inner conductor layers 51 are alternately stacked to each other in the organic wiring structure 41. It is thus possible to provide three power channels to different-voltage power supplies for reliable operation test of the semiconductor devices.

(4) The insulating resin layers 43 to 49 are formed by stacking the plurality of insulating resin film sheets 71 rather than by a known build-up process. It is thus possible to assuredly resolve variation in the thickness of the insulating resin layers 43 to 49 and, by extension, possible to resolve variation in the distance from the pads 61 and 62 to the inner conductor layer 51.

(5) In the present embodiment, the test wiring board 21 is produced by forming the multilayer ceramic substrate 31 and the sheet materials (patterned copper foil/polyimide film sheets 71) of the organic wiring structure 41 separately, and then, stacking and bonding the multilayer ceramic substrate 31 and the sheet materials (patterned copper foil/polyimide film sheets 71) of the organic wiring structure 41 together. It is possible by this production method to shorten the production lead time of the test wiring board 21, as compared to the case of using the build-up process, for cost reduction and production efficiency improvement.

(6) Furthermore, the connection pads 61 and the test pads 62 are formed in two patterning steps, rather than in one patterning step, in the present embodiment. More specifically, the intermediate conductor pattern 76 is roughly formed in the first etching step before the stacking and press-bonding step. Then, the connection pads 61 and the test pads 62 are formed finely by etching the intermediate conductor pattern 76 in the second etching step after the stacking and press-bonding step. By the adoption of such two-step patterning process, the connection pads 61 and the test pads 62 can be prevented from being deformed and broken during the stacking and press-bonding step and can be formed finely with high accuracy. It is thus possible to improve the production yield of the test wiring board 21.

The entire contents of Japanese Patent Application No. 2015-216205 (filed on Nov. 3, 2015) are herein incorporated by reference.

The present invention is not limited to the above embodiment. Various changes and modifications of the above embodiment are possible without departing from the scope of the present invention.

In the above embodiment, the via conductors 53 of the organic wiring structure 41 are formed by printing the silver paste. The conductive paste for the formation of the via conductors 53 is however not limited to the silver paste. A paste containing any metal other than copper, such as tungsten paste or nickel paste, may alternatively be used as the conductive paste for the formation of the via conductors 53. Furthermore, the via conductors 53 may alternatively be formed by any other process such as plating process.

Although the ceramic layers 33 of the multilayer ceramic substrate 31 is formed of sintered alumina in the above embodiment, the material of the ceramic layers 33 is not limited to the sintered alumina. The ceramic layers 33 may alternatively be formed of any other sintered ceramic material. Further, the material of the ceramic layers 33 is not limited to the high-temperature sintered ceramic material such as sintered alumina. A low-temperature sintered ceramic material such as glass ceramic material may alternatively be used as the material of the ceramic layers 33. In the case of using such a low-temperature sintered ceramic material, it is feasible to use silver, copper or an alloy thereof for the formation of the conductors.

In the above embodiment, three first plane layers P11, P12, P13 (as power plane layers) are provided in the organic wiring structure 41 such that one first plane layer P11, P12, P13 is disposed between two second plane layers P2 (as ground plane layers). The number of the power plane layers in the organic wiring structure is however not limited to three. Alternatively, two power plane layers or four or more power plane layers may be provided in the organic wiring structure. Furthermore, two or more power plane layers may be provided between two ground plane layers as needed. For example, it is feasible to provide two or more power plane layers for low-voltage power current supplies.

The second plane layer P2 may alternatively be configured as a dummy pattern having no electrical connection to any conductors although the second plane layer P2 is electrically grounded as a power plane layer in the above embodiment.

The inner conductor layers 51 may include signal wiring in addition to the power plane layers and the ground plane layers.

Although the number of DUT is four in the above embodiment, the number of DUT may be set to any value exceeding four (e.g. ten).

The scope of the present invention is defined with reference to the following claims.

What is claimed is:

1. A wiring board for simultaneous testing of multiple semiconductor devices, comprising:
    a multilayer ceramic substrate having a plurality of ceramic layers and a plurality of conductor layers alternately stacked to each other;
    an organic wiring structure arranged on a main surface of the multilayer ceramic substrate;
    a plurality of connection pads formed on a surface of the organic wiring structure for connection to capacitors; and
    a plurality of test pad groups formed on the surface of the organic wiring structure, each of the test pad groups having a plurality of test pads for testing of any one of the semiconductor devices,
    the organic wiring structure having a plurality of insulating resin layers and a plurality of inner conductor layers alternately stacked to each other such that one of the plurality of insulating resin layers is located outermost of the organic wiring structure,
    the plurality of inner conductor layers including a plurality of first plane layers and one or more second plane layers,
    each of the plurality of first plane layers being divided in a plurality of regions as viewed from the surface of the organic wiring structure,
    each of the one or more second plane layers being placed in a different layer from the first plane layers and having an area larger than that of the first plane layer as viewed from the surface of the organic wiring structure,
    at least a part of the test pads of each of the test pad groups being electrically connected to at least a part of the connection pads via an outermost one of the first plane layers.

2. The wiring board according to claim 1, wherein each of the plurality of first plane layers is a plane layer for providing power supply; and wherein each of the one or more second plane layers is a plane layer for providing proper grounding.

3. The wiring board according to claim 1, wherein the outermost one of the first plane layers is a plane layer for supplying lowest-voltage power current.

4. The wiring board according to claim 1, wherein the test pads of the respective test pad groups are electrically connected to the connection pads via the different regions of the outermost one of the first plane layers.

* * * * *